United States Patent
Cheung et al.

(10) Patent No.: US 7,393,795 B2
(45) Date of Patent: Jul. 1, 2008

(54) METHODS FOR POST-ETCH DEPOSITION OF A DIELECTRIC FILM

(75) Inventors: Robin Cheung, Cupertino, CA (US); Siyi Li, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/346,400

(22) Filed: Feb. 1, 2006

(65) Prior Publication Data
US 2007/0175858 A1    Aug. 2, 2007

(51) Int. Cl.
*H01L 21/302* (2006.01)
(52) U.S. Cl. .................. 438/725; 438/694; 438/738; 438/743; 438/778; 438/781; 134/16; 134/17; 134/25; 216/49; 216/72; 216/80
(58) Field of Classification Search .......... 438/694; 134/16; 216/49
See application file for complete search history.

(56) References Cited

U.S. PATENT DOCUMENTS

| | | | |
|---|---|---|---|
| 6,054,769 A * | 4/2000 | Jeng | 257/758 |
| 6,607,675 B1 | 8/2003 | Hsieh et al. | |
| 2004/0160556 A1 | 8/2004 | Chiang et al. | |
| 2004/0180556 A1 * | 9/2004 | Chiang et al. | 438/781 |
| 2005/0009356 A1 * | 1/2005 | Kojima et al. | 438/700 |

OTHER PUBLICATIONS

Shamiryan, Journal of Vacuum Science and Technology, B 20(5), Sep./Oct. 2002, pp. 1923-1928.*

* cited by examiner

*Primary Examiner*—Duy-Vu N. Deo
*Assistant Examiner*—Maki Angadi
(74) *Attorney, Agent, or Firm*—Patterson & Sheridan, LLP

(57) ABSTRACT

Methods for post-etch deposition on a dielectric film are provided in the present invention. In one embodiment, the method includes providing a substrate having a low-k dielectric layer disposed thereon in a etch reactor, etching the low-k dielectric layer in the etch reactor, and forming a protection layer on the etched low-k dielectric layer. In another embodiment, the method includes providing a substrate having a low-k dielectric layer disposed thereon in an etch reactor, etching the low-k dielectric layer in the reactor, bonding the etched low-k dielectric layer with a polymer gas supplied into the reactor, forming a protection layer on the etched low-k dielectric layer, and removing the protection layer formed on the etched low-k dielectric layer.

27 Claims, 4 Drawing Sheets

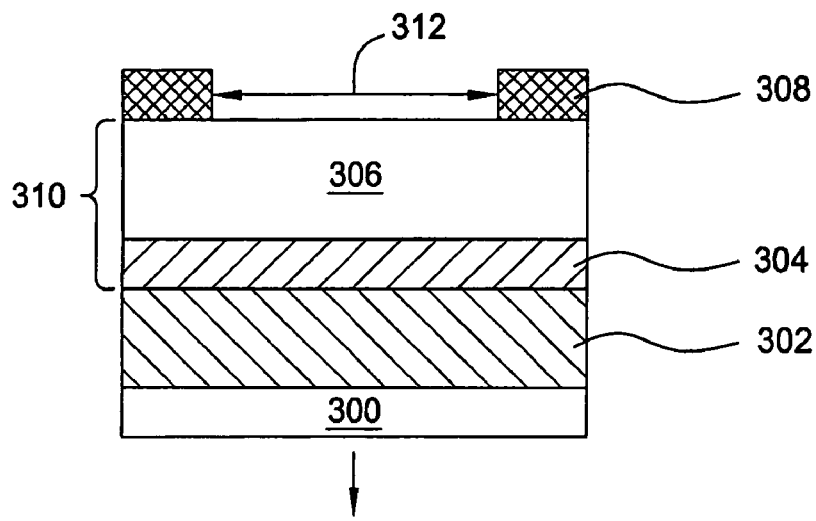
FIG. 3A
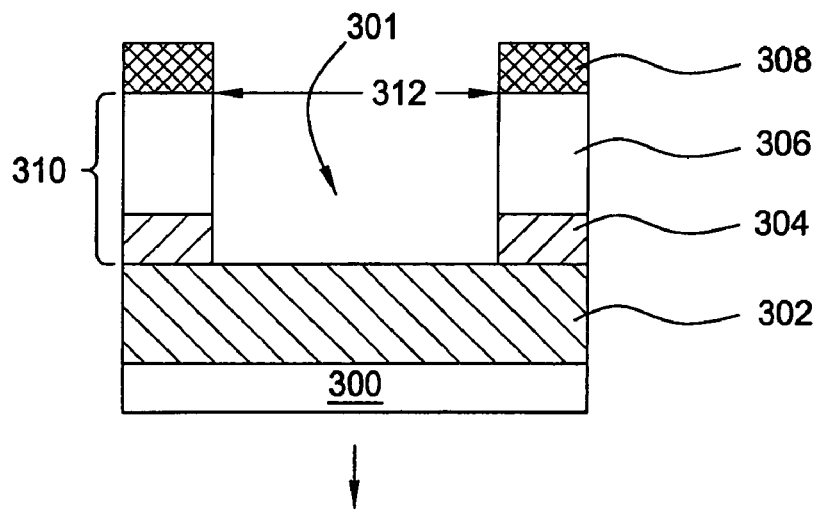
FIG. 3B
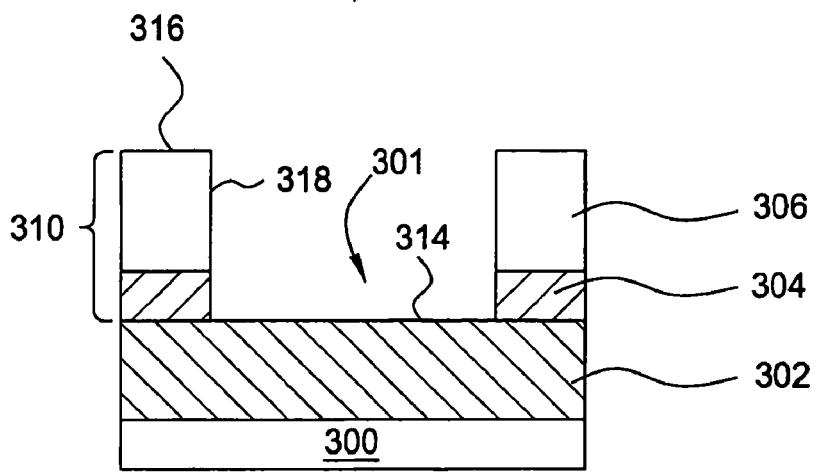
FIG. 3C
SEE
FIG. 3D

METHODS FOR POST-ETCH DEPOSITION OF A DIELECTRIC FILM

BACKGROUND OF THE INVENTION

1. Field of the Invention

The present invention generally relates to semiconductor processing technologies and, more specifically, to a post-etch deposition on a dielectric film in semiconductor processing.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g. sub-micron dimensions), the materials used to fabricate such components contribute to their electrical performance. For example, metal interconnects with low resistance (e.g., copper and aluminum) provide conductive paths between the components on integrated circuits.

Copper is particularly advantageous for use in interconnect structures due to its desirable electrical properties. Copper interconnect system are typically fabricated using a damascene process in which trenches and vias are etched into dielectric layers. The trenches and vias are filled with copper which is then planarized using, for example, a chemical-mechanical planarization (CMP) process.

Copper interconnects are electrically isolated from each other by an insulating material. When the distance between adjacent metal interconnects and/or thickness of the insulating material has sub-micron dimensions, capacitive coupling may potentially occur between such interconnects. Capacitive coupling between adjacent metal interconnects may cause cross talk and/or resistance-capacitance (RC) delay which degrades the overall performance of the integrated circuit. In order to prevent capacitive coupling between adjacent metal interconnects, low dielectric constant (low k) insulating materials (e.g. dielectric constants less than about 4.0) are needed.

During fabrication of the interconnect structure, the dielectric etch processes (e.g., reactive ion etch (RIE), inductively coupled plasma (ICP) etch, and the like) are generally used to form the contact holes and trenches in the low-k insulator layers. However, these etch processes have adversely effected many low-k dielectric materials. For example, silanol terminated group, e.g., Si—OH bonds, may accumulate on the surface of the etched low-k film, thereby causing the carbon depletion at the film surface. Carbon depletion may cause the film surface to absorb moisture when exposed to an ambient environment. The absorbed moisture causes the dielectric constant of the low-k material to undesirably increase, resulting in a "k loss," in the materials dielectric properties. As a result, cross-talk and RC delay may increase after the etching process.

Therefore, there is a need for an improved process for etching low-k materials.

SUMMARY OF THE INVENTION

Methods for post-etch deposition on a dielectric film are provided in the present invention. In one embodiment, the method includes providing a substrate having a low-k dielectric layer disposed thereon in a reactor, etching the low-k dielectric layer in the reactor, and forming a protection layer on the etched low-k dielectric layer.

In another embodiment, the method includes providing a substrate having a low-k dielectric layer disposed thereon in an etch reactor, etching the low-k dielectric layer in the reactor, bonding the etched low-k dielectric layer with a polymer gas supplied into the reactor, and forming a protection layer on the etched low-k dielectric layer.

In yet another embodiment, the method includes providing a substrate having a low-k dielectric layer disposed thereon in an etch reactor, etching the low-k dielectric layer in the reactor, bonding the etched low-k dielectric layer with a polymer gas supplied into the reactor, forming a protection layer on the etched low-k dielectric layer, removing the protection layer formed on the etched low-k dielectric layer, and removing the substrate from the etch reactor.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

FIG. 3A-3E are cross-sectional views of a portion of a composite structure during different stages of the process of FIG. 2.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention include methods for post-etch deposition on a low-k dielectric film performed in an etch chamber. The methods preserve the quality of the low-k dielectric film by depositing a temporary protection layer on the surface of the etched low-k dielectric film after an etching process performed in a single etch chamber.

Figure 1:
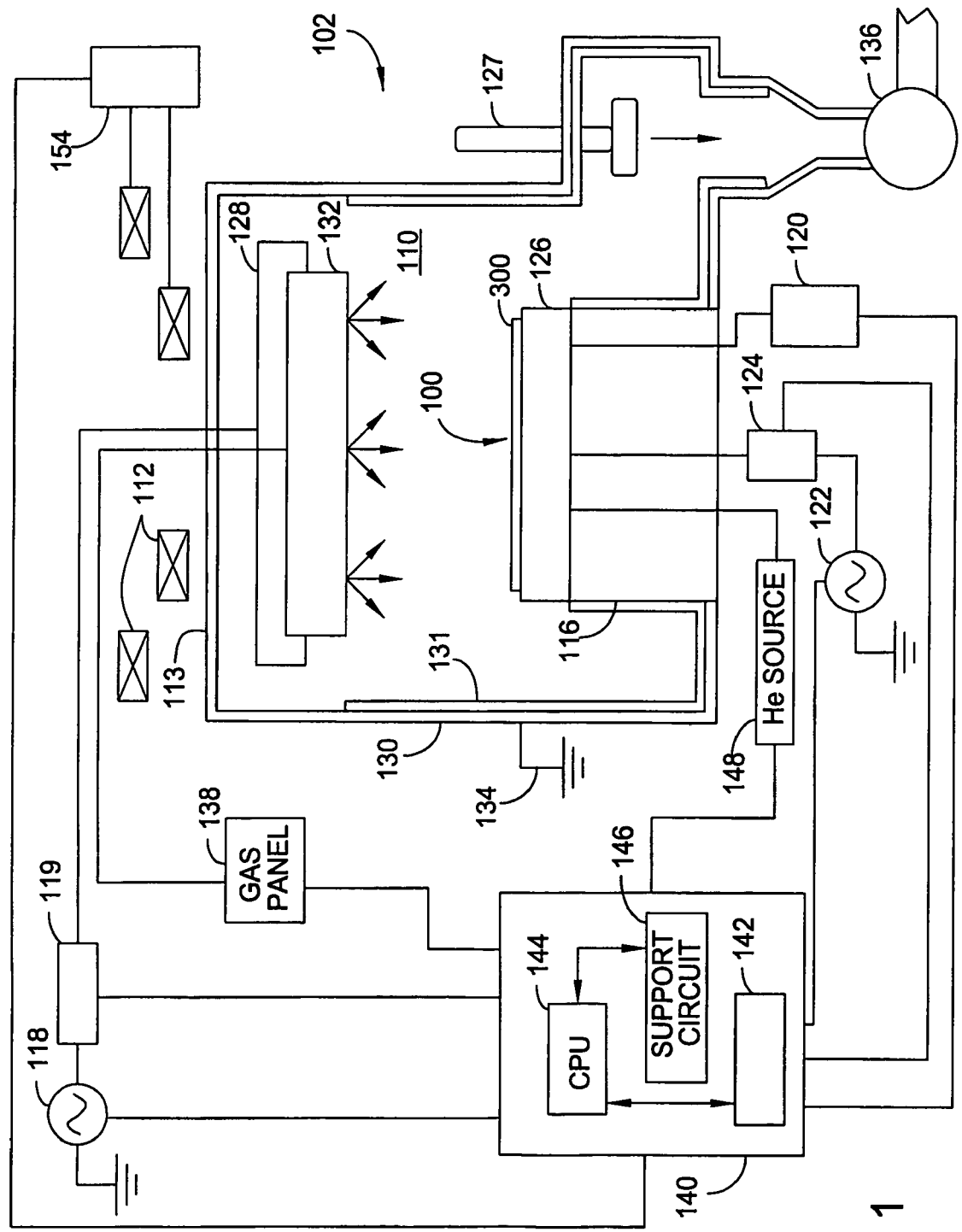
FIG. 1 is a schematic cross-sectional view of a plasma reactor used according to one embodiment of the invention.

FIG. 1 depicts a schematic, cross-sectional diagram of one embodiment of a plasma source etch reactor 102 suitable for performing the present invention. One such etch reactor suitable for performing the invention is the ENABLER® processing chamber, available from Applied Materials, Inc., of Santa Clara, Calif. It is contemplated that the other etch reactors may be adapted to benefit from the invention.

In one embodiment, the reactor 102 includes a process chamber 110 having a conductive chamber wall 130. The temperature of the chamber wall 130 is controlled using liquid-containing conduits (not shown) that are located in and/or around the wall.

The chamber 110 is a high vacuum vessel that is coupled through a throttle valve 127 to a vacuum pump 136. The chamber wall 130 is connected to an electrical ground 134. A liner 131 is disposed in the chamber 110 to cover the interior surfaces of the walls 130. The liner 131 facilitates in-situ self-cleaning capabilities of the chamber 110, so that byproducts and residues deposited on the liner 131 can be readily removed from the liner 131. In one embodiment, the liner 131 is ceramic.

The process chamber 110 also includes a support pedestal 116 and a showerhead 132. The support pedestal 116 is disposed in a spaced-apart relation below the showerhead 132. The support pedestal 116 may include an electrostatic chuck 126 for retaining the substrate 100. Power to the electrostatic chuck 126 is controlled by a DC power supply 120.

The support pedestal 116 is coupled to a radio frequency (RF) bias power source 122 through a matching network 124. The bias power source 122 is generally capable of producing an RF signal having a tunable frequency of from about 50 kHz to about 60 MHz and a bias power of about 0 to 5,000 Watts. Optionally, the bias power source 122 may be a DC or pulsed DC source.

The temperature of the substrate 100 supported on the support pedestal 116 is at least partially controlled by regulating the temperature of the support pedestal 116. In one embodiment, the support pedestal 116 includes a cooling plate (not shown) having channels formed therein for flowing a coolant. In addition, a backside gas, such as helium (He) gas from a gas source 148, is provided into channels disposed between the back side of the substrate 100 and grooves (not shown) formed in the surface of the electrostatic chuck 126. The electrostatic chuck 126 may also include a resistive heater (not shown) within the chuck body to heat the chuck 126 to a steady-state temperature during processing. The backside He gas provides efficient heat transfer between the pedestal 116 and the substrate 100. In one embodiment, the substrate 100 is maintained at a temperature of between about 10 to about 500 degrees Celsius.

The showerhead 132 is mounted to a lid 113 of the processing chamber 110. A gas panel 138 is fluidly coupled to a plenum defined between the showerhead 132 and the lid 113. The showerhead 132 includes a plurality of holes to allow gases provided to the plenum from the gas panel 138 to enter the process chamber 110. The holes in the showerhead 132 may be arranged in different zones such that various gases can be released into the chamber 110 with different volumetric flow rates.

The showerhead 132 and/or an upper electrode 128 positioned proximate thereto is coupled to an RF source power 118 through an impedance transformer 119 (e.g., a quarter wavelength matching stub). The RF source power 118 is generally capable of producing an RF signal having a tunable frequency of about 160 MHz and a source power of about 0 to 5,000 Watts.

The reactor 102 may also include one or more coil segments or magnets 112 positioned exterior to the chamber wall 130, near the chamber lid 113. Power to the coil segment(s) 112 is controlled by a DC power source or a low-frequency AC power source 154.

During processing of the substrate 100, gas pressure within the interior of the chamber 110 is controlled using the gas panel 138 and the throttle valve 127. In one embodiment, the gas pressure within the interior of the chamber 110 is maintained at about 0.1 to 999 mTorr.

A controller 140, including a central processing unit (CPU) 144, a memory 142, and support circuits 146, is coupled to the various components of the reactor 102 to facilitate control of the processes of the present invention. The memory 142 can be any computer-readable medium, such as random access memory (RAM), read only memory (ROM), floppy disk, hard disk, or any other form of digital storage, local or remote to the reactor 102 or CPU 144. The support circuits 136 are coupled to the CPU 144 for supporting the CPU in a conventional manner. These circuits include cache, power supplies, clock circuits, input/output circuitry and subsystems, and the like. A software routine or a series of program instructions stored in the memory 142, when executed by the CPU 144, causes the reactor 102 to perform processes of the present invention.

FIG. 1 only shows one exemplary configuration of various types of plasma reactors that can be used to practice the invention. For example, different types of source power and bias power can be coupled into the plasma chamber using different coupling mechanisms. Using both the source power and the bias power allows independent control of a plasma density and a bias voltage of the substrate with respect to the plasma. In some applications, the source power may not be needed and the plasma is maintained solely by the bias power. The plasma density can be enhanced by a magnetic field applied to the vacuum chamber using electromagnets driven with a low frequency (e.g., 0.1-0.5 Hertz) AC current source or a DC source. In other applications, the plasma may be generated in a different chamber from the one in which the substrate is located, e.g., remote plasma source, and the plasma subsequently guided into the chamber using techniques known in the art.

Figure 2:
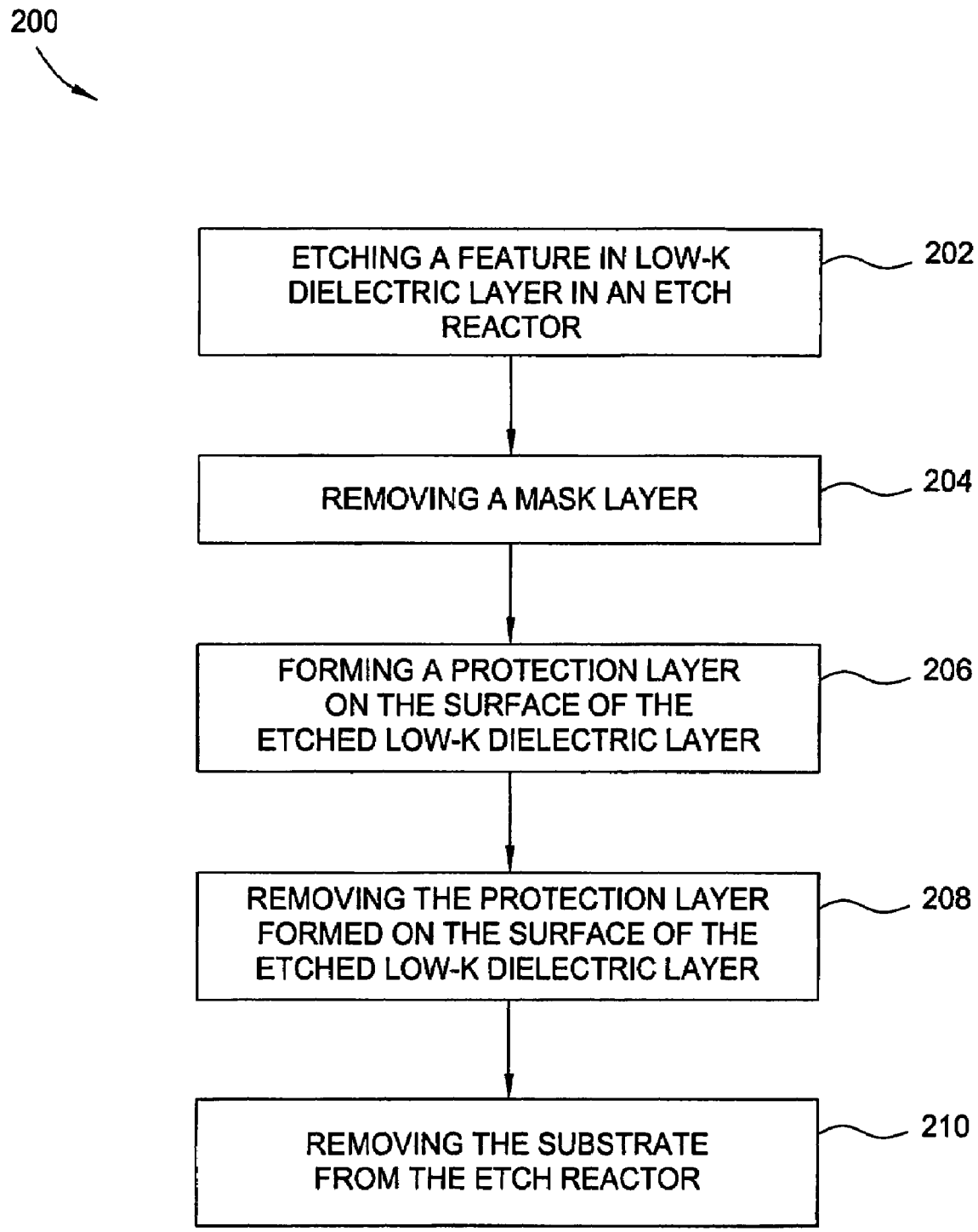
FIG. 2 is a process flow diagram illustrating a method incorporating one embodiment of the invention.

FIG. 2 illustrates a flow diagram of one embodiment of a post-etch deposition process 200 on a dielectric film according to one embodiment of the invention. FIGS. 3A-3E are schematic cross-sectional views corresponding to process 200 illustrating the post-etch deposition process 200. The process 200 may be stored in memory 142 as instructions that executed by the controller 140 to cause the process 200 to be performed in the reactor 102.

The process 200 begins at step 202 by etching a dielectric stack 310 disposed on a substrate 300 in the reactor 102. In one embodiment, the etching step 202 may be utilized to form a trench or via.

The dielectric stack 310, shown prior to step 202 in FIG. 3A, is disposed on a layer 302 having at least one copper line. The dielectric stack 310 includes a low-k dielectric layer 306 over an optional etch stop layer 304. In one embodiment, the low-k dielectric layer 306 is a dielectric material having a dielectric constant less than 4.0. Examples of suitable materials include carbon-containing silicon oxides, such as BLACK DIAMOND® dielectric material available from Applied Materials, Inc., and other polymers, such as polyamides.

The optional etch stop layer 304 has etch characteristics that are different from the low-k dielectric layer 306. In one embodiment, the etch stop layer 304 may be silicon carbide or nitrogen containing silicon carbide materials having a dielectric constant of about 5 or less. An example of the etch stop layer material is BLOK® dielectric material, available from Applied Materials, Inc.

A patterned photoresist layer 308 is formed on the low-k dielectric layer 306. The patterned photoresist layer 308 may comprise a conventional carbon-based, organic or polymeric materials used to pattern integrated circuit. At least a portion of the dielectric layer 306 is exposed through one or more openings 312 of the patterned photoresist layer 308.

At step 202, the film stack 310 is etched through the opening, thereby defining a feature 301, such as a trench or via, in the dielectric layer 306, as shown in FIG. 3B. A portion of the dielectric layer 306 is removed to expose a surface 314 of the copper lines present in the layer 302 at the bottom of the feature 301.

In one embodiment, the low-k dielectric layer 306 is etched at step 202 using a plasma formed from fluorine and carbon. The dielectric layer 306 may be etched in an etch chamber, such as the reactor 102 described in FIG. 1 or other suitable reactors. In one embodiment, the etch process may be performed by supplying carbon and fluorine containing gas, such as carbon tetrafluoride ($CF_4$), at between about 5 to about 250 sccm, applying a power between about 50 Watt to about 2000 Watt, maintaining a temperature between about 0 degrees Celsius to about 50 Celsius, and controlling process pressure between about 5 mTorr to about 200 mTorr into the reactor. In another embodiment, at least a carrier gas, such as argon (Ar), may also be supplied accompanying with the carbon and fluorine containing gas into the reactor. The carrier gas may be supplied between about 50 to about 500 sccm.

At step 204, the photoresist layer 308 is removed, e.g., stripped, as shown in FIG. 3C. The photoresist layer 308 may be removed by exposure to an oxygen-based plasma formed in the reactor 102. In one embodiment, the stripping may comprise flowing an oxygen-based gas such as oxygen or ozone and a gas such as nitrogen into the etch reactor 102. A source power of between about 100 Watts to about 2000 Watts may be applied by the power source 118 to maintain a plasma formed from the oxygen-based gas. The reactor 102 may be maintained at a pressure of between about 4 mTorr to about 200 mTorr. The temperature o the substrate may be controlled between about 0 degree Celsius and about 40 degrees Celsius.

After the etching and stripping process, the top 316 and sidewall 318 of the etched low-k dielectric layer 306 may be attacked by the plasma generated during the process and results in the bonding of the surface of etched low-k film 306 terminated with silanol bonds, e.g., Si—OH. Hydrogen bonded hydroxyl, or silanol bonds may induce carbon depletion and alter the surface properties of the low-k dielectric layer 306 from hydrophobic to hydrophilic, thereby encouraging the moisture uptake and increasing k value.

Figure 3D:
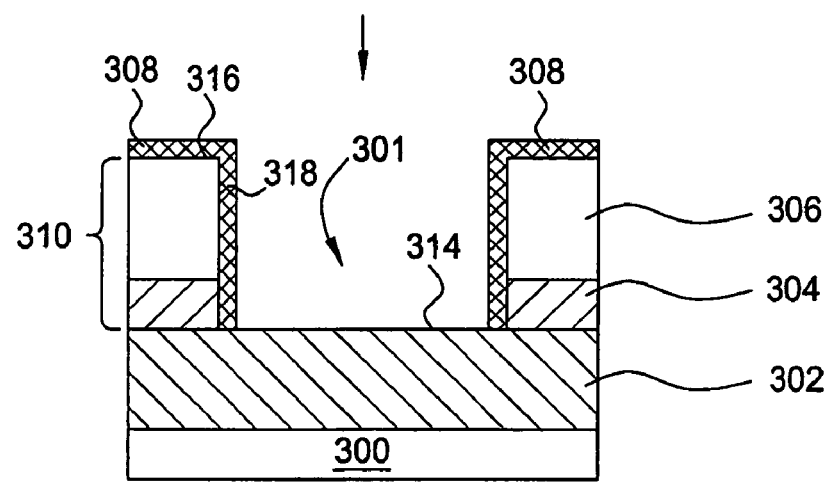

At step 206, a protection layer 308 is formed on the surface of the etched low-k dielectric layer 306, as shown in FIG. 3D. The protection layer 308 is deposited by flowing a process gas mixture into the reactor 102 from the gas panel 138. The process gas mixture flowed into the etch reactor alters the chemical composition of the etched dielectric layer 306 by depositing a protection layer 308 thereon that reacts with the layer 306. The depositing process repairs the bonding of the sidewall 318 and top 316 of the etch layer 306. The process gas mixture may include a polymer gas containing carbon and silicon elements capable of serving as a hydrophobic functional group. In one embodiment, the process gas mixture may include, but not limited to, a polymer gas accompanying with at least one carrier gas, such as argon gas (Ar), helium gas (He), nitric oxide (NO), carbon monoxide (CO), nitrous oxide ($N_2O$), oxygen gas ($O_2$), nitrogen gas ($N_2$) and the like. Suitable examples of the polymer gas comprise fluoroalkyl polyoxyethylene, polydimethylsioxane, trimethylsilane (3MS), tetramethylsilane (TMS), octamethylcyclotetrasilane (OMCTS), hexamethyldisiliane (HMDS) and among others.

The functional group provided by the polymer gas in the process gas mixture bonds with etched dielectric layer 306 and substantially converts the silanol bonds, e.g., Si—OH, into silyl bonds, e.g., Si—Si, or Si—C rich bonds during and/or after deposition. As such, by the deposition of the protection layer 308, the film property of the etched dielectric layer 306 is at least partially or completely changed from a hydrophilic state to a hydrophobic state, thereby proving increased resistance to moisture while exposing to an ambient environment. Furthermore, the dielectric constant of the dielectric layer 306 may be recovered as with the dielectric constant without performing etching process. The "k-loss" associated with conventional etching and stripping may also be eliminated.

Several process parameters are regulated while the process gas mixture is supplied into the etch reactor. In one embodiment, a pressure of the process gas mixture in the etch reactor is regulated between about 10 mTorr to about 500 mTorr, and the substrate temperature is maintained between about 0 degrees Celsius and about 100 degrees Celsius. RF source power may be applied at a power of about 0 Watts to about 1000 Watts. The process gas mixture may be flowed at a rate between about 1 sccm to about 100 sccm.

The thickness of the protection layer may be determined by any suitable methods. In one embodiment, the protection layer may be deposited having a thickness between about 1 Å to about 200 Å. In another embodiment, the thickness of the protection layer may be determined by monitoring optical emissions, expiration of a predefined time period or by another indicator for measuring that the protection layer is sufficiently formed.

Figure 3E:
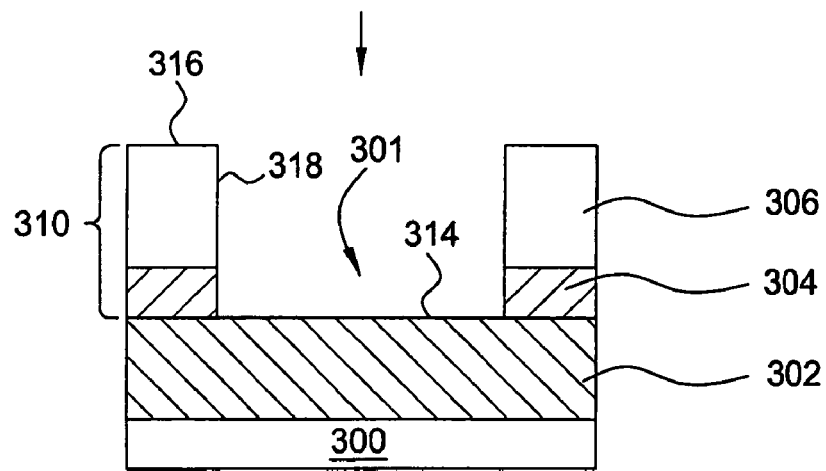

At step 208, the protection layer 308 is removed from the substrate surface after converting the silanol bonds on the sidewall 318 and top 316 of the etched layer 306 into silyl bonds during deposition, as shown in FIG. 3E. The removal of the protection layer 308 advantageously retains the defined dimension and structure of the etched layer 306, and also maintains the substrate surface in a desirable hydrophobic state, thereby allowing the altered film on the sidewall 318 and top 316 of the etched layer 306 possessing the improved moisture resistance and the required k value.

In one embodiment, the process gas used for removing the protection layer may include a non-hydrogen containing gas. Suitable examples for non-hydrogen containing gas may include, but not limited to, tetrafluoromethane gas ($CF_4$), nitrogen trifluoride gas ($NF_3$), and the like. In another embodiment, the process gas used for removing the protection layer may include a non-hydrogen containing gas supplied with at least one carrier gas. The carrier gas may include, but not limited to, argon gas (Ar), helium gas (He), nitric oxide (NO), carbon monoxide (CO), nitrous oxide ($N_2O$), oxygen gas ($O_2$), nitrogen gas ($N_2$) and the like.

Several process parameters are regulated while the process gas is supplied into the etch reactor. In one embodiment, a pressure of the process gas in the etch reactor is regulated between about 4 mTorr to about 350 mTorr, and the substrate temperature is maintained between about 0 degrees Celsius and about 40 degrees Celsius. RF source power may be applied at a power of about 50 Watts to about 50 Watts. The process gas may be flowed at a rate between about 1 sccm to about 100 sccm.

At step 210, the substrate 300 is removed from the etch reactor 102 subsequent to the protection layer removal. The post-etch deposition process on the dielectric film is in-situ deposited and completed in the etch reactor. In an alternatively embodiment, the protection layer may be optionally ex-situ deposited or etched in another vacuum processing chamber.

Advantageously, the temporary protection layer used herein advantageously alters the surface properties and improves the stability of the etched low-k film, while enabling a longer inter-chamber process time by converting the etched low-k film into a hydrophobic status with increased moisture resistance. Thus, greater process flexibility may be realized without degradation of film properties.

Thus, the present application provides improved methods for post-etch deposition on a dielectric film after etching in semiconductor processing. The method advantageously facilitates the dielectric film property control after etching by depositing a temporary protection layer on the surface of the etched dielectric layer integrated and performed in an etch reactor.

While the foregoing is directed to embodiments of the present invention, other and further embodiments of the invention may be devised without departing from the basic scope thereof, and the scope thereof is determined by the claims that follow.

What is claimed is:

1. A method for post-etch deposition on a dielectric film, comprising:
   (a) providing a substrate having a low-k dielectric layer disposed thereon in an etch reactor;
   (b) etching the low-k dielectric layer through a photoresist mask to form features in the etch reactor;
   (c) removing the photoresist mask after etching in the presence of an oxygen containing plasma; and
   (d) depositing a protection layer on the surfaces of the features formed in the etched low-k dielectric layer, wherein the protection layer decreases the dielectric constant of the etched dielectric layer.

2. The method of claim 1, wherein depositing a protection layer further comprises:
   flowing at least a carrier gas into the etch reactor, wherein the carrier gas includes at least one of argon gas (Ar), oxygen ($O_2$), helium (He), nitric oxide (NO), carbon monoxide (GO), nitrous oxide ($N_2O$), or nitrogen gas ($N_2$).

3. The method of claim 1, wherein depositing a protection layer further comprising:
   flowing at least one polymer gas into the etch reactor after feature etching is complete, wherein the polymer gas is a carbon and silicon containing gas.

4. The method of claim 3, wherein the polymer gas has a hydrophobic functional group.

5. The method of claim 1, wherein depositing a protection layer further comprises:
   controlling process pressure in the reactor between about 10 to about 500 mTorr, and
   maintaining the substrate at a temperature between about 0 and about 100 degrees Celsius.

6. The method of claim 1, wherein depositing a protection layer further comprises:
   modifying a surface of the etched dielectric layer from hydrophilic to hydrophobic state.

7. The method of claim 3, wherein the polymer gas is selected from a group includes at least one of fluoroalkyl polyoxyethene, polydimethylsioxane, trimethylsilane, octamethylcyclotetrasilane, hexamethyldisiliane, or tetramethylsilane.

8. The method of claim 1 further comprising:
   in-situ depositing the protection layer in the reactor; and
   subsequently removing the substrate from the reactor.

9. The method of claim 1 further comprising:
   removing the protection layer formed on the etched low-k dielectric layer.

10. The method of claim 9, wherein removing the protection layer further comprises:
    flowing a non-hydrogen containing gas into the etch reactor.

11. The method of claim 10, wherein the non-hydrogen containing gas includes at least one of tetrafluoromethane gas ($CF_4$) and nitrogen trifluoride gas ($NF_3$).

12. The method of claim 9 further comprising:
    in-situ removing the protection layer in the reactor; and
    subsequently removing the substrate from the reactor.

13. The method of claim 9, wherein removing the protection layer further comprises:
    controlling process pressure in the reactor between about 4 to about 350 mTorr, and
    maintaining the substrate at a temperature between about 0 to about 40 degrees Celsius.

14. The method of claim 10, wherein flowing the non-hydrogen containing gas further comprises:
    flowing the non-hydrogen containing gas between about 1 to 100 sccm.

15. A method for post-etch deposition on a dielectric film, comprising:
    (a) providing a substrate having a low-k dielectric layer disposed thereon in an etch reactor;
    (b) etching the low-k dielectric layer to form features in the reactor;
    (c) removing the photoresist mask after etching in the presence of an oxygen containing plasma;
    (d) bonding the surface of the features formed in the etched low-k dielectric layer with a polymer gas supplied into the reactor;
    (e) depositing a protection layer on the etched low-k dielectric layer, the protection layer decreasing the dielectric constant of the low-k dielectric layer; and
    (f) removing the protection layer formed on the etched low-k dielectric layer.

16. The method of claim 15, wherein the polymer gas is a carbon and silicon containing gas.

17. The method of claim 15, wherein the polymer gas has a hydrophobic functional group.

18. The method of claim 15, wherein depositing a protection layer further comprises:
    altering the surface property of the etched dielectric layer by the protection layer formed thereon.

19. The method of claim 15, wherein bonding the etched low-k dielectric layer further comprises:
    modifying the surface of the etched dielectric layer from hydrophilic to hydrophobic state.

20. The method of claim 15, wherein the polymer gas includes at least one of fluoroalkyl polyoxyethene, polydimethylsioxane, trimethylsilane, octamethylcyclotetrasilane, hexamethyldisiliane, or tetramethylsilane.

21. The method of claim 15 further comprises:
    in-situ depositing the protection layer in the reactor;
    in-situ removing the protection layer in the reactor; and
    subsequently removing the substrate from the etch reactor.

22. The method of claim 15, wherein removing the protection layer further comprises:
    flowing a non-hydrogen containing gas into the etch reactor.

23. The method of claim 22, wherein the non-hydrogen containing gas includes at least one of tetrafluoromethane gas ($CF_4$) and nitrogen trifluoride gas ($NF_3$).

24. The method of claim 15 further comprising:
    in-situ removing the protection layer in the reactor; and
    subsequently removing the substrate from the reactor.

25. A method for post-etch deposition on a dielectric film, comprising:
    (a) providing a substrate having a low-k dielectric layer disposed thereon in an etch reactor;
    (b) etching the low-k dielectric layer through a mask to form features in the reactor;
    (c) providing a polymer gas into the reactor after the mask has been removed using an oxygen containing plasma;

(d) depositing a protection layer using the polymer gas on the etched low-k dielectric layer, wherein the protection layer decreases the dielectric constant of the etched low-k dielectric layer;

(e) removing the protection layer formed on the etched low-k dielectric layer; and (f) removing the substrate from the etch reactor.

26. The method of claim 25, wherein depositing a protection layer further comprises:

ex-situ depositing the protection layer in a second etch reactor.

27. The method of claim 25, wherein removing the protection layer further comprises:

ex-situ removing the protection layer in a third etch reactor.

* * * * *

UNITED STATES PATENT AND TRADEMARK OFFICE
CERTIFICATE OF CORRECTION

| | | |
|---|---|---|
| PATENT NO. | : 7,393,795 B2 | Page 1 of 1 |
| APPLICATION NO. | : 11/346400 | |
| DATED | : July 1, 2008 | |
| INVENTOR(S) | : Cheung et al. | |

It is certified that error appears in the above-identified patent and that said Letters Patent is hereby corrected as shown below:

In the Title (54):

Please delete "of" and insert --on-- therefor;

In the References Cited (56):

Please delete "2004/0160556 A1 8/2004 Chiang et al." and insert --2004/0180556 A1 9/2004 Chiang et al.-- therefor;

In the Claims:

Column 7, Claim 2, Line 27, please delete "GO" and insert --CO-- therefor.

Signed and Sealed this

Ninth Day of December, 2008

JON W. DUDAS
*Director of the United States Patent and Trademark Office*